(12) United States Patent
Bangsaruntip et al.

(10) Patent No.: US 8,809,957 B2
(45) Date of Patent: Aug. 19, 2014

(54) NANOWIRE FET AND FINFET HYBRID TECHNOLOGY

(71) Applicant: International Business Machines Corporation, Armonk, NY (US)

(72) Inventors: Sarunya Bangsaruntip, Mount Kisco, NY (US); Josephine B. Chang, Mahopac, NY (US); Leland Chang, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/050,921

(22) Filed: Oct. 10, 2013

(65) Prior Publication Data

US 2014/0027855 A1    Jan. 30, 2014

Related U.S. Application Data

(62) Division of application No. 13/286,311, filed on Nov. 1, 2011, now Pat. No. 8,580,624.

(51) Int. Cl.
    *H01L 27/12*      (2006.01)
(52) U.S. Cl.
    USPC .......................................................... 257/351
(58) Field of Classification Search
    CPC ................ H01L 21/10826; H01L 27/1211
    USPC ......................................................... 257/351
    See application file for complete search history.

(56) References Cited

U.S. PATENT DOCUMENTS

| | | | |
|---|---|---|---|
| 7,037,994 B2 | 5/2006 | Sugita et al. |
| 7,087,477 B2 | 8/2006 | Fried et al. |
| 7,244,549 B2 | 7/2007 | Iwasawa et al. |
| 7,303,855 B2 | 12/2007 | Hatakeyama et al. |
| 7,358,025 B2 | 4/2008 | Hatakeyama |
| 7,365,401 B2 | 4/2008 | Anderson et al. |
| 7,452,778 B2 | 11/2008 | Chen et al. |
| 7,598,516 B2 | 10/2009 | Avouris et al. |

(Continued)

OTHER PUBLICATIONS

D. Tu et al., "3D CMOL Based on CMOS/Nanomaterial Hybrid Technology," 7th IEEE Conference on Nanotechnology, pp. 879-882 (Aug. 2007).

(Continued)

*Primary Examiner* — Kimberly Rizkallah
*Assistant Examiner* — Mounir Amer
(74) *Attorney, Agent, or Firm* — Vazken Alexanian; Michael J. Chang, LLC

(57) ABSTRACT

Hybrid nanowire FET and FinFET devices and methods for fabrication thereof are provided. In one aspect, a method for fabricating a CMOS circuit having a nanowire FET and a finFET includes the following steps. A wafer is provided having an active layer over a BOX. A first region of the active layer is thinned. An organic planarizing layer is deposited on the active layer. Nanowires and pads are etched in the first region of the active layer using a first hardmask. The nanowires are suspended over the BOX. Fins are etched in the second region of the active layer using a second hardmask. A first gate stack is formed that surrounds at least a portion of each of the nanowires. A second gate stack is formed covering at least a portion of each of the fins. An epitaxial material is grown on exposed portions of the nanowires, pads and fins.

6 Claims, 8 Drawing Sheets

(56) References Cited

U.S. PATENT DOCUMENTS

| | | |
|---|---|---|
| 7,608,893 B2 | 10/2009 | Orlowski |
| 2008/0213956 A1 | 9/2008 | Black et al. |
| 2009/0302372 A1* | 12/2009 | Chang et al. .................. 257/327 |
| 2010/0193770 A1 | 8/2010 | Bangsaruntip et al. |
| 2010/0207208 A1* | 8/2010 | Bedell et al. .................. 257/346 |

OTHER PUBLICATIONS

Jing Zhuge et al., "High-Performance Si Nanowire Transistors on Fully Si Bulk Substrate From Top-Down Approach: Simulation and Fabrication," IEEE Transactions on Nanotechnology, vol. 9, No. 1, pp. 114-122 (Jan. 2010).

Dmitri B. Strukov et al., "CMOL FPGA: a reconfigurable architecture for hybrid digital circuits with two-terminal nanodevices" Nanotechnology vol. 16, 888-900 (Apr. 2005).

Yu Tian et al., "New Self-Aligned Silicon Nanowire Transistors on Bulk Substrate Fabricated by Epi-Free Compatible CMOS Technology: Process Integration, Experimental Characterization of Carrier Transport and Low Frequency Noise," IEDM, pp. 895-898 (Dec. 10-12, 2007).

H. -S. P. Wong, "Beyond the conventional transistor," Solid-State Electronics, vol. 49, pp. 755-762 (May 2005).

B. Yu et al., "FinFET Scaling to 10nm Gate Length," IEDM (Dec. 2002).

* cited by examiner

US 8,809,957 B2

NANOWIRE FET AND FINFET HYBRID TECHNOLOGY

CROSS-REFERENCE TO RELATED APPLICATION(S)

This application is a divisional of U.S. application Ser. No. 13/286,311 filed on Nov. 1, 2011, now U.S. Pat. No. 8,580,624, the disclosure of which is incorporated by reference herein.

FIELD OF THE INVENTION

The present invention relates to integrated circuits, and more particularly, to hybrid nanowire field effect transistor (FET) and FinFET devices and methods for fabrication thereof

BACKGROUND OF THE INVENTION

Complementary metal-oxide semiconductor (CMOS) circuits typically include a combination of n-type and p-type field effect transistor (FET) devices. Each FET device includes a source, a drain and a channel between the source and the drain. A gate electrode over and/or surrounding the channel regulates electron flow between the source and the drain.

As feature sizes of CMOS circuits get increasingly smaller (commensurate with current technology) a number of challenges arise. For instance, scaling brings about issues related to electrostatics and mobility degradation in CMOS devices. A finFET architecture offers increased scaling opportunities beyond that attainable with planar devices. See, for example, B. Yu et al., "FinFET Scaling to 10 nm Gate Length," IEDM (2002). FinFET devices exhibit fast switching times and high current densities.

However, some key technical challenges still have yet to be overcome with CMOS device scaling. One challenge is gate length scaling (and maintaining performance while doing so). Another is lithography at increasingly scaled dimensions.

Thus, techniques that permit gate length scaling without performance degradation and a more uniform CMOS circuit structure to pattern with lithography would be desirable.

SUMMARY OF THE INVENTION

The present invention provides hybrid nanowire field effect transistor (FET) and FinFET devices and methods for fabrication thereof. In one aspect of the invention, a method for fabricating a complementary metal-oxide semiconductor (CMOS) circuit having a nanowire field-effect transistor (FET) and a finFET is provided. The method includes the following steps. A wafer is provided having an active layer over a buried oxide (BOX), wherein the active layer has at least a first region and a second region. The first region of the active layer is thinned, such that the first region and the second region of the active layer form a stepped surface. An organic planarizing layer is deposited on the active layer so as to provide a flat surface over the stepped surface. A first lithography hardmask is formed on the organic planarizing layer over the first region of the active layer and a second lithography hardmask is formed on the planarizing layer over the second region of the active layer. Nanowires and pads are etched in the first region of the active layer using the first hardmask, wherein the pads are attached at opposite ends of the nanowires in a ladder-like configuration. The nanowires are suspended over the BOX. Fins are etched in the second region of the active layer using the second hardmask. A first gate stack is formed that surrounds at least a portion of each of the nanowires, wherein the portions of the nanowires surrounded by the first gate stack serve as a channel region of the nanowire FET. A second gate stack is formed covering at least a portion of each of the fins, wherein the portions of the fins covered by the second gate stack serve as a channel region of the finFET. An epitaxial material is grown on exposed portions of the nanowires, pads and fins, wherein the epitaxial material grown on the exposed portions of the nanowires and pads serve as source and drain regions of the nanowire FET and wherein the epitaxial material grown on the exposed portions of the fins serve as source and drain regions of the finFET.

In another aspect of the invention, a CMOS circuit is provided. The CMOS circuit includes a wafer having a BOX; a nanowire FET on the BOX and a finFET on the BOX. The nanowire FET includes nanowires and pads attached at opposite ends of the nanowires in a ladder-like configuration, wherein the nanowires are suspended over the BOX; a first gate stack that surrounds at least a portion of each of the nanowires, wherein the portions of the nanowires surrounded by the first gate stack serve as a channel region of the nanowire FET; and an epitaxial material on portions of the nanowires and pads that serve as source and drain regions of the nanowire FET. The finFET includes a plurality of fins; a second gate stack covering at least a portion of each of the fins, wherein the portions of the fins covered by the second gate stack serve as a channel region of the finFET; and an epitaxial material on portions of the fins that serve as source and drain regions of the finFET.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-16 are diagrams illustrating an exemplary methodology for fabricating a complementary metal-oxide semiconductor (CMOS) circuit. The CMOS circuit will include an n-type field-effect transistor (NFET) device and a p-type FET (PFET) device. In the example now provided, the NFET device will employ a nanowire FET architecture and the PFET will employ a finFET architecture.

The fabrication process begins with a semiconductor-on-insulator (SOI) wafer. See FIG. 1. An SOI wafer typically includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device in which the nanowires and fins will be patterned. Thus, the SOI layer will be referred to herein as an active layer.

Figure 1:
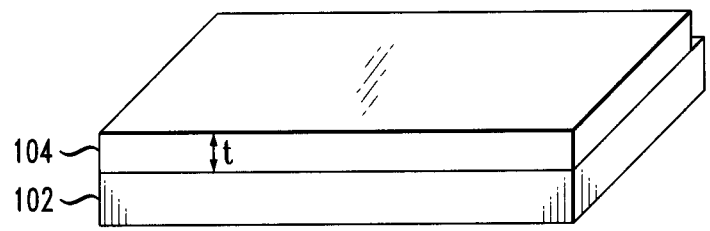
FIG. 1 is a three-dimensional diagram illustrating a starting structure for a complementary metal-oxide semiconductor (CMOS) circuit fabrication process, i.e., a silicon-on-insulator (SOI) wafer having an active layer over a buried oxide (BOX) according to an embodiment of the present invention.

In the example shown in FIG. 1, the starting wafer includes an active layer 104 over a BOX 102. For ease of depiction, a substrate typically located below the BOX, is not shown. According to an exemplary embodiment, active layer 104 is formed from a semiconducting material, such as silicon (Si) (e.g., crystalline silicon), silicon germanium (SiGe) or germanium (Ge). Thus, the active layer 104 may also be referred to as a "semiconductor device layer" or simply as a "semiconductor layer."

Further, as will be apparent from the following description, a thickness t of active layer 104 will be equivalent to a final desired fin height for the PFET device. According to an exemplary embodiment, active layer 104 preferably has a thickness of from about 5 nanometers (nm) to about 40 nm. Commercially available SOI wafers typically have a thicker SOI layer. Thus, the SOI layer of a commercial wafer can be thinned using techniques such as oxidative thinning to achieve the desired active layer thickness for the present techniques.

Figure 2:
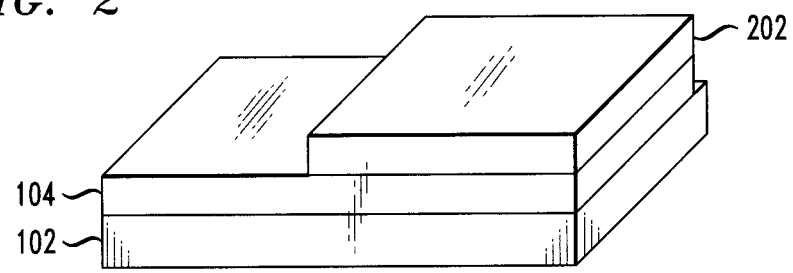
FIG. 2 is a three-dimensional diagram illustrating a hardmask having been formed over a portion of the wafer in which an n-type fin field effect transistor (NFET) device will be formed according to an embodiment of the present invention.

Next, as shown in FIG. 2, a hardmask 202 is formed over a portion of the active layer 104 in which the PFET device will be formed. The hardmask 202 protects the region it covers during the active layer thinning step (see below). According to an exemplary embodiment, hardmask 202 is formed from a nitride hardmask material, such as silicon nitride (SiN) which is blanket deposited onto the active layer 104 using, e.g., low-pressure chemical vapor deposition (LPCVD), and then patterned using lithography and nitride-selective reactive ion etching (RIE) techniques known in the art to open up holes in (i.e., remove) the nitride hardmask in regions where the nanowire NFET device will be formed.

Figure 3:
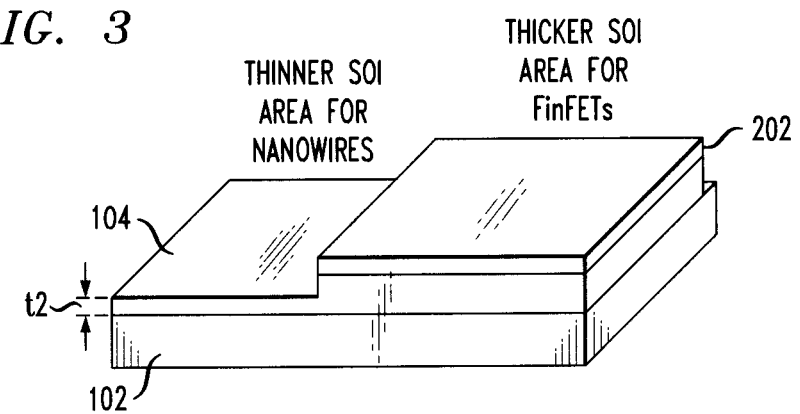
FIG. 3 is a three-dimensional diagram illustrating a region of the active layer not masked by the hardmask having been thinned according to an embodiment of the present invention.
Figure 4:
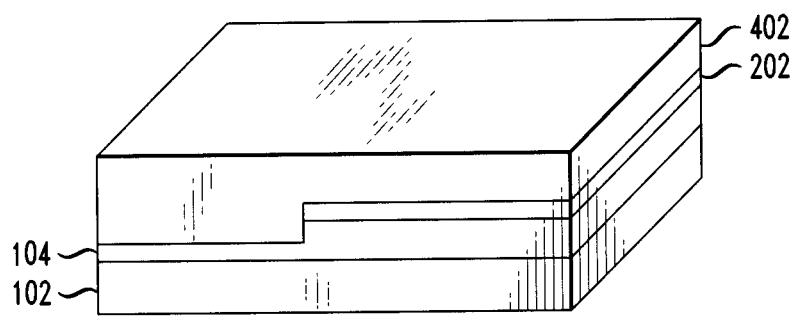
FIG. 4 is a three-dimensional diagram illustrating an organic planarizing layer having been deposited on the stepped active layer according to an embodiment of the present invention.

A region of the active layer 104 not masked by the hardmask 202 (i.e., the region that will be used to form the nanowire NFET device) is then thinned. See FIG. 3. According to an exemplary embodiment, this thinning is achieved using a timed RIE which is selective for the material of the active layer 104 vis-à-vis the hardmask 202. Although, as shown in FIG. 3, the hardmask 202 may be thinned in the process. By way of example only, the active layer 104 is reduced in this process to a thickness t2 of from about 3 nm to about 20 nm. The result is vertical steps having been formed in the active layer, i.e., a first thicker region (i.e., having thickness t) and a second thinner region (i.e., having a thickness t2) having been formed in active layer 104. As described below, nanowires will be formed in this thinned region of the active layer 104.

An organic planarizing layer 402 is then spin-coated onto the stepped active layer 104. See FIG. 4. The organic planarizing layer will serve to fill in the stepped surface of the active layer, providing a flat planar surface for nanowire and fin patterning (see below). According to an exemplary embodiment, the organic planarizing layer 402 is formed from an aromatic cross-linkable polymer (e.g., naphthalene-based) in a solvent and is coated onto the active layer 104 to a thickness of from about 30 nm to about 300 nm. Spin-coating ensures that the organic planarizing layer sufficiently fills in the stepped topography of the active layer.

Other suitable materials for use in the organic planarizing layer 402 include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference herein.

A post-apply bake is then performed to cross-link the organic planarizing layer and bake off the solvent. According to an exemplary embodiment, the post-apply bake is conducted at a temperature of up to about 250 degrees Celsius (° C.), e.g., from about 200° C. to about 250° C.

Figure 5:
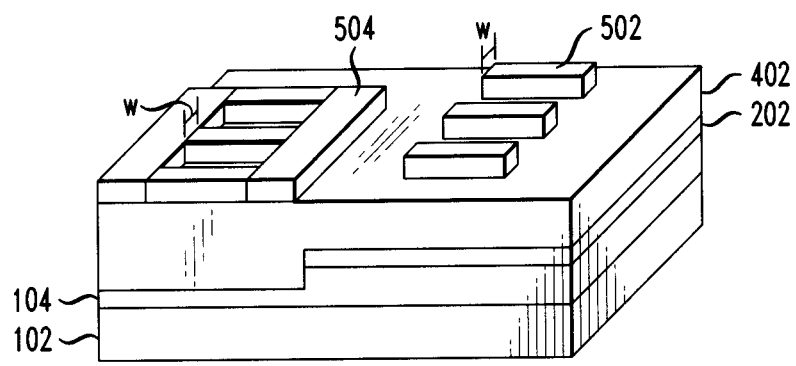
FIG. 5 is a three-dimensional diagram illustrating a fin lithography hardmask having been patterned on the organic planarizing layer over the thicker region of the active layer and a nanowire/pad lithography hardmask having been patterned on the organic planarizing layer over the thinner region of the active layer according to an embodiment of the present invention.

Standard lithography techniques are then used to pattern a first hardmask 502 which will be used to pattern fins in the thicker region of the active layer 104 (also referred to herein as a fin lithography hardmask) and a second hardmask 504 which will be used to pattern nanowires (and pads) in the thinner region of the active layer 104 (also referred to herein as a nanowire/pad lithography hardmask). Since the organic planarizing layer 402 provides a continuous flat surface over the two regions of the active layer, the hardmasks 502 and 504 can be formed from a common material, using a single hardmask fabrication process. By way of example only, a suitable hardmask material (e.g., a nitride material, such as SiN) can be blanket deposited over the organic planarizing layer 402 and then patterned using a standard photolithography process with the footprint and location of hardmasks 502 and 504. As shown in FIG. 5, the fin lithography hardmask has been patterned on the organic planarizing layer over the thicker region of the active layer and the nanowire/pad lithography hardmask having been patterned on the organic planarizing layer over the thinner region of the active layer.

The fin lithography hardmask will dictate the dimensions and spacing (i.e., pitch, or distance between fins) in the final FinFET device. Thus, the fin lithography hardmask should be patterned with the desired dimensions and pitch commensurate with those of the fins. Further, as shown in FIG. 5, the nanowire/pad hardmask has a ladder-like configuration. This ladder-like configuration will be transferred to the active layer, wherein the nanowires will be patterned like rungs of a ladder interconnecting the pads (see below). The pads will be used to form source and drain regions of the nanowire FET. For some advanced patterning techniques such as sidewall image transfer, it may be preferable for the nanowires and fins to have the same lithographic width w.

An etch through the hardmasks 502/504 and the organic planarizing layer 402 is then used to completely form the nanowires and pads in the thinner region of the active layer 104 and only partially etch the fins in the thicker region of the active layer 104. See FIG. 6. According to an exemplary embodiment, this etch is performed using a series of RIE steps. For example, a first RIE step can be used that is selective for etching the organic planarizing layer. This first RIE step can be performed using an oxygen-containing, e.g., $N_2/O_2$ chemistry. A second RIE step can then be used to transfer the fin pattern into the hardmask 202, forming a patterned hardmask (see FIG. 6). This second RIE step may be performed using, for example, a $CF_4$ etch chemistry. A third RIE step can then be used to transfer the nanowire/fin pattern into the active layer. This third RIE step may be performed using a fluorine-containing, e.g., $CHF_3/CF_4$, or bromine chemistry. The third RIE is end-pointed when the nanowires and pads in the thinner region of the active layer are fully etched, and any remaining organic planarizing layer is stripped with, for example, a wet strip or $O_2$ plasma. At this point the fins in the thicker region of the active layer will only be partially etched. Namely, this third etch step into the active layer only extends part way through the thicker region of the active layer. Such a configuration is important since the remaining active layer will protect the BOX 102 in the thicker region during the process of undercutting the BOX 102 in the thinner region below the nanowires. See description of FIG. 7, below.

Figure 6:
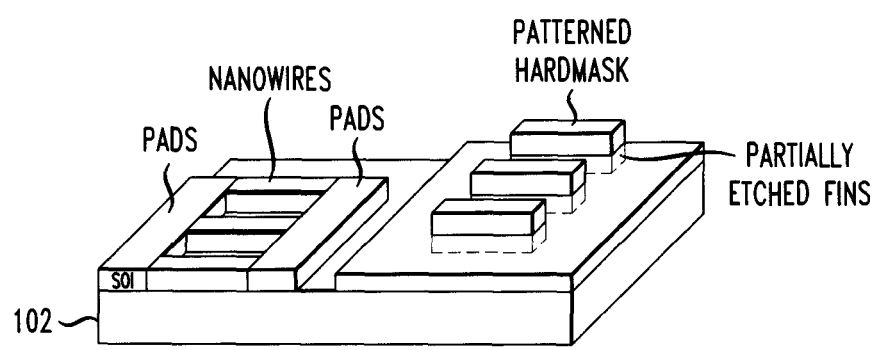
FIG. 6 is a three-dimensional diagram illustrating an etch having been performed through the fin and the nanowire/pad lithography hardmasks to completely form nanowires and pads in the thinner region of the active layer and only partially etch fins in the thicker region of the active layer according to an embodiment of the present invention.
Figure 7:
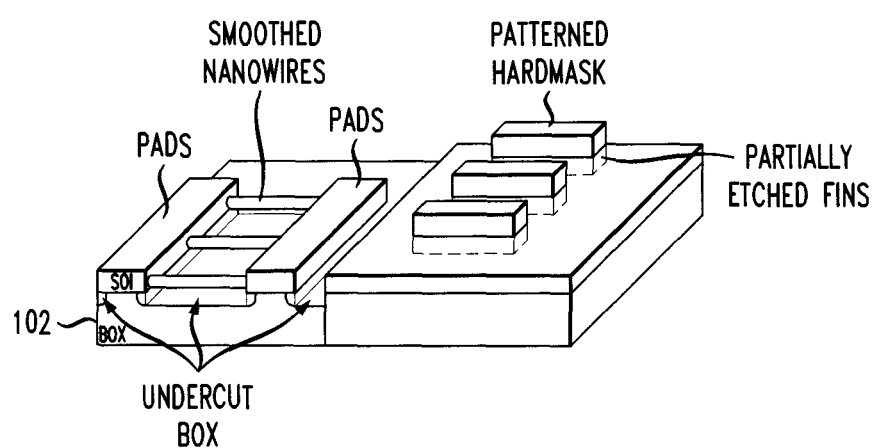
FIG. 7 is a three-dimensional diagram illustrating the nanowires having been suspended over the BOX according to an embodiment of the present invention.
Figure 8:
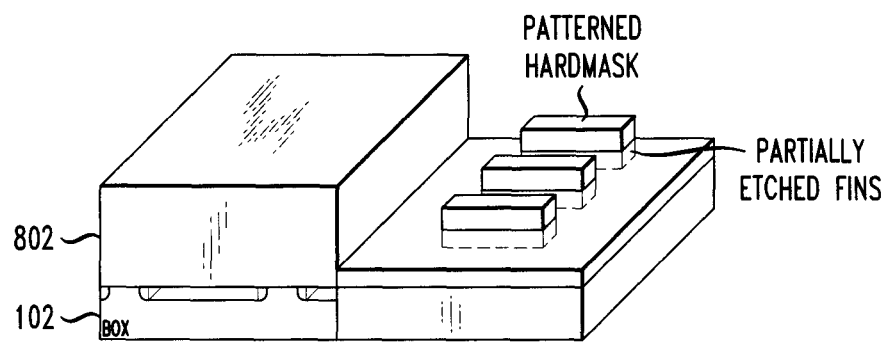
FIG. 8 is a three-dimensional diagram illustrating a resist layer having been formed over the nanowires and pads according to an embodiment of the present invention.

As shown in FIG. 6, the nanowires and pads are formed having a ladder-like configuration. Namely, the pads are attached at opposite ends of the nanowires like the rungs of a ladder.

The nanowires are then suspended over the BOX. See FIG. 7. According to an exemplary embodiment, the nanowires are suspended by undercutting the BOX 102 beneath the nanowires using an isotropic etching process. This process also laterally etches portions of the BOX 102 under the pads. See FIG. 7. The isotropic etching of the BOX 102 may be performed, for example, using a diluted hydrofluoric acid (DHF). A 100:1 DHF etches approximately 2 nm to 3 nm of BOX layer 102 per minute at room temperature. As highlighted above, the incomplete etch in the thicker active regions where the fins are formed protects the fins from BOX undercut during this step.

Following the isotropic etching of the BOX 102 the nanowires may be smoothed to give them an elliptical and in some cases a cylindrical cross-sectional shape. The smoothing of the nanowires may be performed, for example, by annealing the nanowires in a hydrogen-containing atmosphere. Exemplary annealing temperatures may be from about 600° C. to about 1,000° C., and a hydrogen pressure of from about 600 torr to about 700 torr may be employed. Exemplary techniques for suspending and re-shaping nanowires may be found, for example, in U.S. Patent Application Publication No. 2010/0193770 A1, filed by Bangsaruntip et al., entitled "Maskless Process for Suspending and Thinning Nanowires," the entire contents of which are incorporated by reference herein.

In order to finish etching the fins, a resist layer 802 is first formed over the nanowires and pads, to protect the nanowires and pads during etching of the fins. See FIG. 8. To form resist 802, a suitable resist material is coated on the device and then patterned using conventional lithography and etching techniques into resist 802. Suitable resist materials include, but are not limited to poly(methyl methacrylate) (PMMA).

Figure 9:
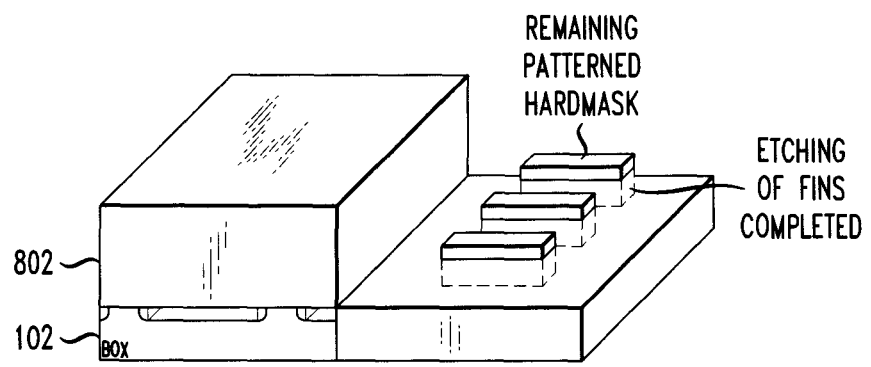
FIG. 9 is a three-dimensional diagram illustrating etching of the fins having been completed, wherein the fins and pads are protected by the resist layer during the etch according to an embodiment of the present invention.
Figure 10:
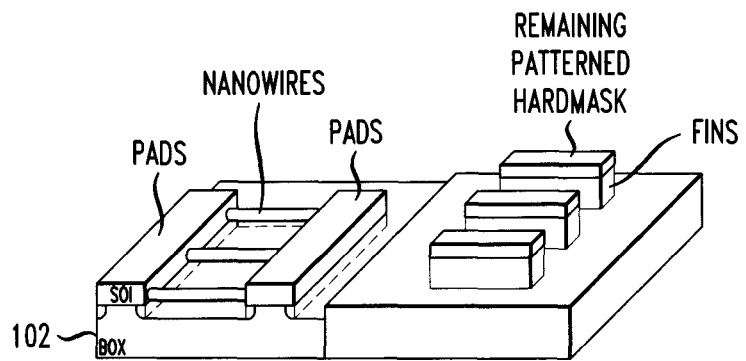
FIG. 10 is a three-dimensional diagram illustrating the resist layer having been removed according to an embodiment of the present invention.
Figure 11:
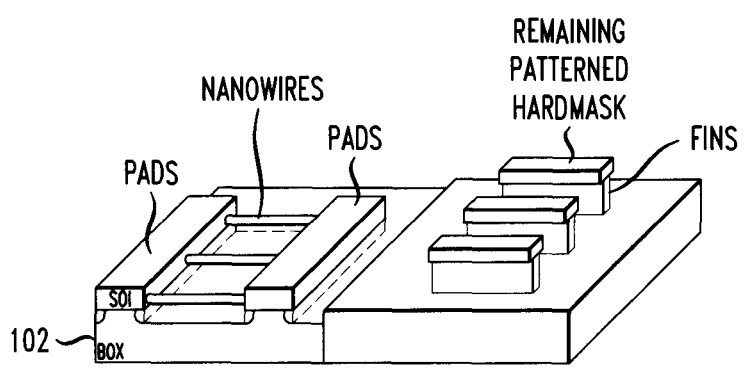
FIG. 11 is a three-dimensional diagram illustrating the nanowires and fins having optionally been thinned and smoothed according to an embodiment of the present invention.

The etching of the fins is then completed. See FIG. 9. Suitable RIE etch chemistries for this step were provided above. As shown in FIG. 9, the patterned hardmask on the fins is thinned during this fin etching process. The remaining patterned hardmask may optionally be removed at this point, using for example a RIE step. Alternatively, as shown in the figures, the remaining patterned hardmask may be removed later in the process.

Following the fin etch, the resist 802 can be removed using, for example, a resist stripper. See FIG. 10. Suitable resist strippers include, but are not limited to, N-methyl pyrolidinone (NMP).

Optionally, the nanowires and fins can be thinned and smoothed. See FIG. 11. As described in conjunction with the description of FIG. 7, above, the nanowires may be re-shaped (e.g., smoothed) to an elliptical (e.g., circular) cross-sectional shape earlier in the process. Now, the nanowires and fins are thinned, which also can serve to give them a smoother surface.

By way of example only, the nanowires and fins may be thinned using a high-temperature (e.g., from about 700° C. to about 1,000° C.) oxidation of the nanowires and fins followed by etching of the grown oxide. The oxidation and etching process may be repeated x number of times to achieve desired nanowire and fin dimensions.

A gate stack 1202 is then patterned on the nanowires and a gate stack 1204 is patterned on the fins. See FIG. 12. The portions of the nanowires and fins surrounded/covered by the gates stacks will serve as channel regions of the respective FET devices. Gate stack 1202 contains a dielectric (or combination of dielectrics), a first gate material (such as a metal (s)) and optionally a second gate material 1208a (such as a metal or doped polysilicon layer), all that surround the nanowires (see FIG. 13, described below). Gate stack 1204 contains a dielectric (or combination of dielectrics), a first gate material (such as a metal(s)) and optionally a second gate material 1208b (such as a metal or doped polysilicon layer) that covers at least a portion of the fins, wherein the gate dielectric separates the gate materials 1208 from the fins. For clarity, in the following description and in the figures, the materials (i.e., dielectrics and gate materials) are given the designation 'a' (e.g., 1208a) when reference is being made to the gate stack 1202 and the designation 'b' (e.g., 1208b) when reference is being made to the gate stack 1204. However, according to an exemplary embodiment, the materials given the designations 'a' and 'b' are the same materials (i.e., have the same composition as one another) since they are formed at the same time (in the same step). For example, as will be apparent from the following description, the second gate material 1208a in gate stack 1202 and the second gate material 1208b in gate stack 1204 are preferably formed from the same material that is deposited over both of the gate stacks and then patterned.

Figure 12:
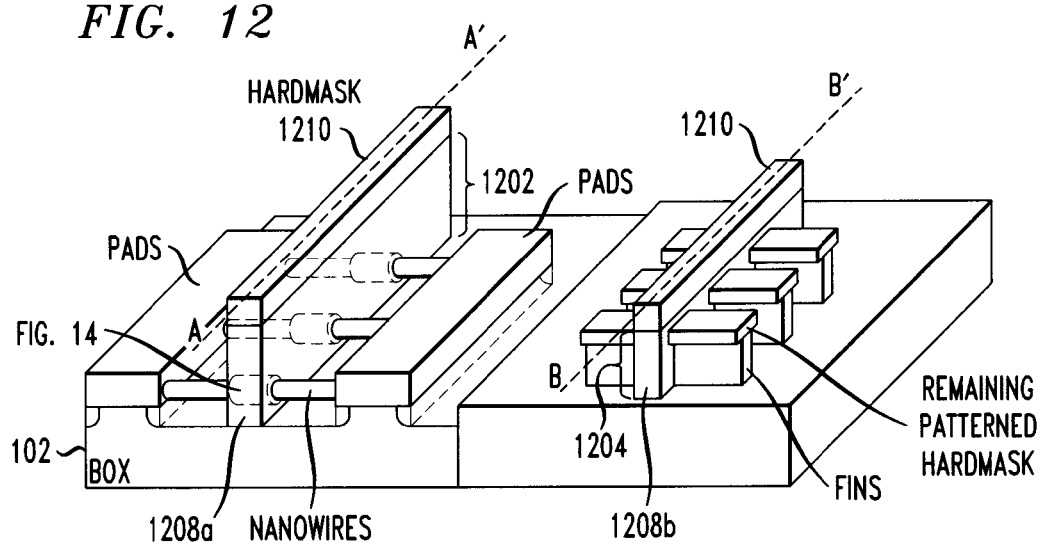
FIG. 12 is a three-dimensional diagram illustrating a gate stack having been patterned on the nanowires and a gate stack having been patterned on the fins according to an embodiment of the present invention.
Figure 13A:
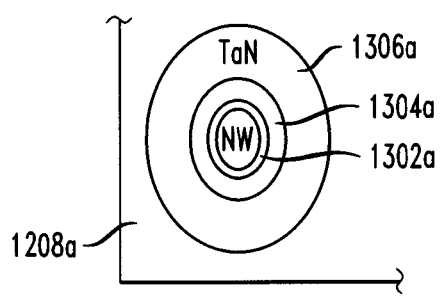
FIG. 13A is a cross-sectional diagram illustrating a cut through a portion of the nanowire gate stack according to an embodiment of the present invention.
Figure 13B:
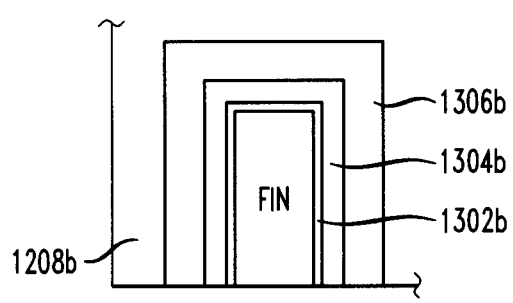
FIG. 13B is a cross-sectional diagram illustrating a cut through a portion of the fin gate stack according to an embodiment of the present invention.

As shown in FIG. 12, since the nanowires have been suspended over the BOX as described above, gate stack 1202 completely surrounds at least a portion of each of the nanowires. This is referred to as a gate-all-around (GAA) configuration.

According to an exemplary embodiment, gate stacks 1202 and 1204 are formed by depositing a conformal gate dielectric film 1302a and 1302b such silicon dioxide ($SiO_2$), silicon oxynitride (SiON), or hafnium oxide ($HfO_2$) (or other hi-K material) around both the nanowires (labeled "NW") and the fins, respectively. See FIG. 13A which provides a view of a cross-sectional cut (i.e., along line A-A') through a portion of gate stack 1202 and FIG. 13B which provides a view of a cross-sectional cut (i.e., along line B-B') through a portion of gate stack 1204. Optionally, a second conformal gate dielectric film 1304a and 1304b that includes, for example, $HfO_2$, may be applied over gate dielectric film 1302a and 1302b, respectively. A (first) gate material 1306a and 1306b is then deposited over the conformal gate dielectric film 1302a and 1302b (or over optional second conformal gate dielectric film 1304a and 1304b). According to an exemplary embodiment, the gate material 1306a and 1306b is a conformal metal gate film that includes, for example, tantalum nitride (TaN) or titanium nitride (TiN).

Optionally, a second gate material such as doped polysilicon or metal may then be blanket deposited onto the structure (i.e., over the gate material 1306a and 1306b so as to surround the nanowires and fins. By way of reference to FIG. 12, hardmasks 1210 (e.g., a nitride hardmask, such as SiN) may then be formed on the second gate material, wherein the hardmasks correspond to gate lines of the nanowire FET and FinFET. Standard patterning techniques can be used to form the hardmasks 1210. The gate material(s) and dielectric(s) are then etched by directional etching that results in straight sidewalls of the gate stacks 1232 and 1204, as shown in FIG. 12. The second gate material, by this etching step, forms second gate material 1208a and 1208b over gate stacks 1202 and 1204, respectively. If present, any remaining hardmask on the fins is also removed by the etching (see FIG. 14).

Figure 14:
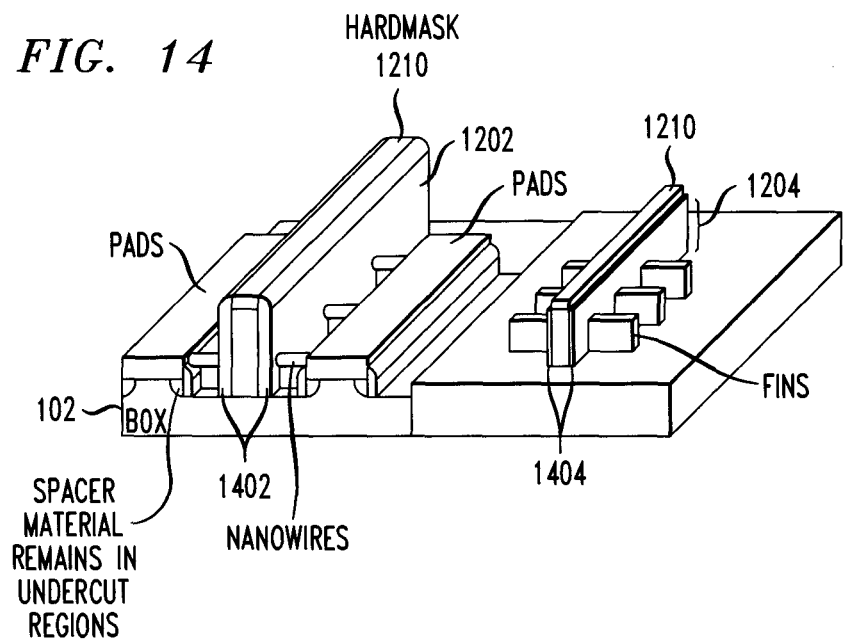
FIG. 14 is a three-dimensional diagram illustrating spacers having been formed on opposite sides of gate stacks according to an embodiment of the present invention.

Spacers 1402 are formed on opposite sides of gate stack 1202 and spacers 1404 are formed on opposite sides of gate stack 1204. See FIG. 14. According to an exemplary embodiment, spacers 1402 and 1404 are formed by depositing a blanket dielectric film such as silicon nitride and etching the dielectric film from all horizontal surfaces by RIE. As shown in FIG. 14, some of the deposited spacer material can remain in the undercut regions, since the RIE in that region is blocked by the pads.

Figure 15:
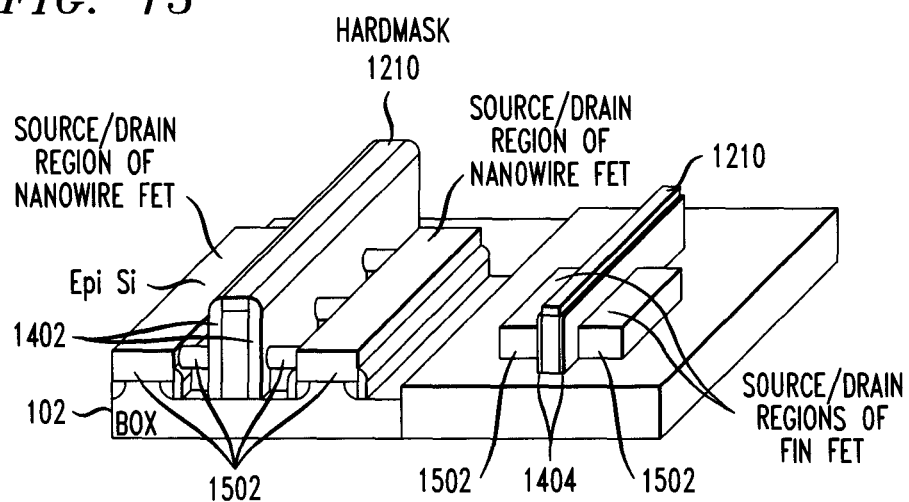
FIG. 15 is a three-dimensional diagram illustrating selective epitaxial silicon growth having been used to thicken the exposed portions of the nanowires, pads and fins so as to form source and drain regions of the devices according to an embodiment of the present invention.
Figure 16:
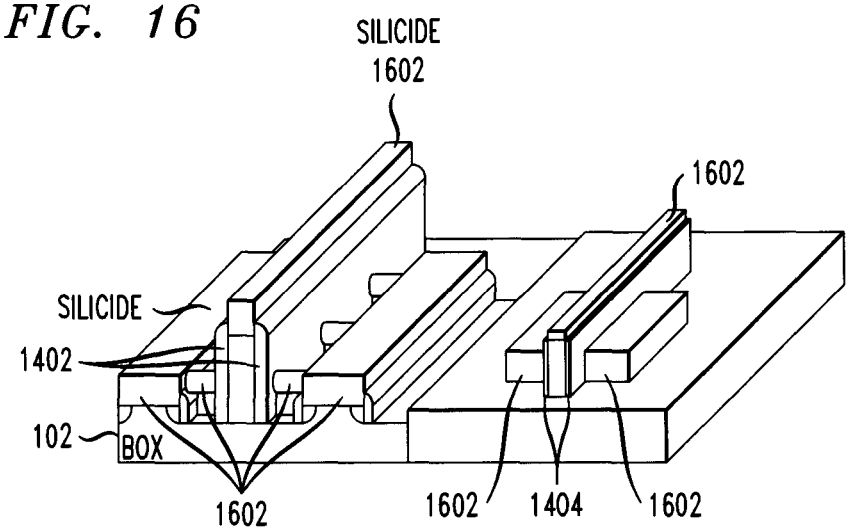
FIG. 16 is a three-dimensional diagram illustrating a silicide having been formed on the epitaxial silicon according to an embodiment of the present invention.

A selective epitaxial material such as silicon (Si), silicon germanium (SiGe), or silicon carbide (SiC) 1502 is then grown to thicken the exposed portions of the nanowires, pads and fins (i.e., those portions not covered by a gate stack or spacers). See FIG. 15. As shown in FIG. 15, the epitaxial silicon may merge the fins together with epitaxial silicon. The growth process might involve epitaxially growing, for example, in-situ doped Si or SiGe that may be either n-type or p-type doped. The in-situ doped epitaxial growth process forms source and drain regions of the nanowire FET and of the FinFET (see FIG. 15). By way of example only, a chemical vapor deposition (CVD) reactor may be used to perform the epitaxial growth. For example, for silicon epitaxy, precursors include, but are not limited to, $SiCl_4$, $SiH_4$ combined with HCL. The use of chlorine allows selective deposition of silicon only on exposed silicon. A precursor for SiGe growth may be $GeH_4$, which may obtain deposition selectivity without HCL. Precursors for dopants may include $PH_3$ or $AsH_3$ for n-type doping and $B_2H_6$ for p-type doping. Deposition temperatures may range from about 550° C. to about 1,000° C. for pure silicon deposition, and as low as 300° C. for pure Ge deposition.

Finally, a contact material such as a silicide, germanide, germanosilicide, etc. 1602 is formed on the exposed epitaxial silicon 1502. See FIG. 16. Examples of contact materials include, but are not limited to, nickel silicide or cobalt silicide. When nickel (Ni) is used, the nickel silicide phase is formed due to its low resistivity. By way of example only, formation temperatures can be from about 400° C. to about 600° C. Once the contact material formation is performed, capping layers and vias for connectivity (not shown) may be formed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A complementary metal-oxide semiconductor (CMOS) circuit, comprising:
   a wafer having a buried oxide (BOX) and an active layer on the BOX, wherein the active layer is configured to have at least one first region with a thickness t1 and at least one second region with a thickness t2, and wherein t2 is less than t1;
   a nanowire field-effect transistor (FET) on the BOX formed in the second region of the active layer comprising:
      nanowires and pads patterned in the second region of the active layer, wherein the pads are attached at opposite ends of the nanowires in a ladder-like configuration, and wherein the nanowires are suspended over the BOX;
      a first gate stack that surrounds at least a portion of each of the nanowires, wherein the portions of the nanowires surrounded by the first gate stack serve as a channel region of the nanowire FET;
      an epitaxial material on portions of the nanowires and pads that serve as source and drain regions of the nanowire FET;
   a finFET on the BOX formed in the first region of the active layer comprising:
      a plurality of fins patterned in the first region of the active layer, wherein a height of the fins patterned in the first region of the active layer is greater than a thickness of the nanowires and pads patterned in the second region of the active layer based on the first region of the active layer being thicker than the second region of the active layer;

a second gate stack covering at least a portion of each of the fins, wherein the portions of the fins covered by the second gate stack serve as a channel region of the finFET; and an epitaxial material on portions of the fins that serve as source and drain regions of the finFET.

2. The CMOS circuit of claim 1, further comprising spacers on opposite sides of the first gate stack and on opposite sides of the second gate stack.

3. The CMOS circuit of claim 1, further comprising a contact material both i) on the epitaxial material on the nanowires and pads and ii) on the epitaxial material on the fins.

4. The CMOS circuit of claim 1, wherein t1 is from about 5 nanometers to about 40 nanometers, and t2 is from about 3 nanometers to about 20 nanometers.

5. The CMOS circuit of claim 1, wherein the nanowire FET is an n-type field-effect transistor (NFET) device, and the finFET is a p-type field-effect transistor (PFET) device.

6. The CMOS circuit of claim 1, wherein the first gate stack and the second gate stack each comprises:

a first conformal gate dielectric film;

a second conformal gate dielectric film on the first conformal gate dielectric film; and a conformal metal gate film on a side of the second conformal gate dielectric film opposite the first conformal gate dielectric film, wherein the first conformal gate dielectric film is present on the nanowires in the first gate stack and on the fins in the second gate stack, and wherein the first conformal gate dielectric film, the second conformal gate dielectric film, and the conformal metal gate film each have a same composition in the first gate stack as the first conformal gate dielectric film, the second conformal gate dielectric film, and the conformal metal gate film in the second gate stack.

* * * * *